United States Patent
Fukuoka et al.

[11] Patent Number: 6,122,766
[45] Date of Patent: Sep. 19, 2000

[54] REED-SOLOMON DECODER HAVING A THREE-STAGE PIPELINE STRUCTURE

[75] Inventors: Toshihiko Fukuoka, Osaka; Yoshihiko Fukumoto, Kyoto; Kazuhiro Ohta, Osaka, all of Japan

[73] Assignee: Matsushita Electric Industrial Co., Ltd., Osaka, Japan

[21] Appl. No.: 08/951,525

[22] Filed: Oct. 16, 1997

[30] Foreign Application Priority Data

Oct. 25, 1996 [JP] Japan .................................. 8-283707

[51] Int. Cl.⁷ .................................................. H03M 13/00
[52] U.S. Cl. ............................................................ 714/784
[58] Field of Search .................................. 714/749, 763, 714/744, 745, 785, 784, 782, 781

[56] References Cited

U.S. PATENT DOCUMENTS

| | | | |
|---|---|---|---|
| 4,747,103 | 5/1988 | Iwamura et al. | 714/755 |
| 5,379,305 | 1/1995 | Weng | 714/744 |
| 5,396,502 | 3/1995 | Owsley et al. | . |
| 5,428,630 | 6/1995 | Weng et al. | 714/763 |
| 5,432,822 | 7/1995 | Kaewell, Jr. | 375/340 |
| 5,570,378 | 10/1996 | Inoue et al. | 714/747 |
| 5,610,929 | 3/1997 | Yamamoto | 714/785 |
| 5,771,244 | 6/1998 | Reed et al. | 714/752 |
| 5,818,855 | 10/1998 | Foxcroft | 714/759 |
| 5,887,005 | 3/1999 | Sharma | 714/784 |
| 5,889,792 | 3/1999 | Zhang et al. | 714/784 |
| 5,905,740 | 5/1999 | Williamson | 714/784 |
| 5,944,848 | 8/1999 | Huang | 714/784 |

FOREIGN PATENT DOCUMENTS 03195216  8/1991  Japan .
08139612  5/1996  Japan .

OTHER PUBLICATIONS

Wei, C.–H. et al., High–Speed Reed–Solomon decoder for correcting errors and erasures, IEEE, p. 246 to 254, Aug. 1993.

Oh, Kyutaeg et al., An Efficient Reed–Solomon Decoder VLSI with Erasure Correction, IEEE, p. 193 to 201, May 1997.

Iwaki, Tetsuo et al., Architecture of A High Speed Reed–Solomon Decoder, IEEE, p. 75 to 82, Jan. 1994.

Shao, Howard et al., On THe VLSI Desigh of a Pipeline Reed–Solomon Decoder Using Systolic Arrays, IEEE, p. 1273 to 1288, Oct. 1988.

Chen, Hung–Wei et al., A New VLSI Architecture of Reed Solomon Decoder with Erasure Function, IEEE, p. 1455 to 1459, May 1995.

Moon Ho Lee et al., A High Speed Reed–Solomon Decoder, IEEE, p. 362 to 367, Jan. 1995.

*Primary Examiner*—Albert De Cady
*Assistant Examiner*—Shelly A Chase
*Attorney, Agent, or Firm*—McDermott, Will & Emery

[57] ABSTRACT

A syndrome calculation unit 101 forming a first pipeline stage, a Euclidean algorithm arithmetic operation/error value calculation unit 102 and a Chien search unit 103 together forming a second pipeline stage, and an error correction unit 105 forming a third pipeline stage are provided. The unit 102 implements, by iterative use of a single inverse element calculator, a single Galois multiplier, and a single Galois adder, the Euclidean algorithm arithmetic operation of finding an error locator polynomial $\sigma(z)$ and an error evaluator polynomial $\omega(z)$ from a syndrome polynomial $S(z)$ and the calculation of finding an error value $e_u$ by dividing an error evaluation value $\omega(\alpha^{-ju})$ by an error locator polynomial differential value $\sigma'(\alpha^{-ju})$.

7 Claims, 9 Drawing Sheets

Fig. 7

| BITS | DETAILS OF CONTROL | LABELS | NAMES | OPERATION STATES | COMBINATIONS OF OPERATION STATES |
|---|---|---|---|---|---|
| 0 | INITIAL DATA INPUT CONTROL | initreg_ctl | il | 1:active 0:inactive | |
| 1 | INPUT DATA CONTROL OF SHIFT REGISTERS | reg_ctl[2:0] | sel0 | 0:sftdtA 1:addatA 2:intA0 | (sel0, sel1)<br>0: (0, 1) 1: (1, 0)<br>3: (2, 2) 4: (2, 0)<br>5: (0, 2) 6: (0, 0) |
| 2 | | | | | |
| 3 | | | sel1 | 0:sftdtB 1:addatB 2:intM0 | |
| 4 | INPUT DATA CONTROL OF INVERSE ELEMENT CALCULATOR AND GALOIS MULTIPLIER | mulin_ctl[2:0] | cal0 | 0:rvdtA 1:rvdtB 2:prvdtA 3:prvdtB 4:sgmd | (cal0, cal1)<br>0: (1, 1) 1: (0, 2)<br>2: (2, x) 3: (3, x)<br>4: (4, 0) 5: (x, 3)<br>6: (x, 4) |
| 5 | | | | | |
| 6 | | | cal1 | 0:omgmgn 1:mldtA 2:mldtB 3:pmldtB 4:pmldtB | |
| 7 | FIRST REGISTER CONTROL | mulreg_ctl [1:0] | revdmul | 1:active 0:inactive | (revdmul, sben, revdat)<br>0: (0, 0, 1) 1: (0, 1, 0)<br>2: (1, 0, 0) 3: (0, 0, 0) |
| 8 | | | sben | 1:active 0:inactive | |
| | | | revdat | 1:active 0:inactive | |
| 9 | SECOND REGISTER CONTROL | breg_ctl | mul | 1:active 0:inactive | |
| 10 | INPUT DATA CONTROL OF GALOIS ADDER AND DATA TRANSFER CONTROL BETWEEN SHIFT REGISTERS | adin_ctl[2:0] | cal2 | 0:addtA 1:addtB 2:paddtA 3:paddtB 4:addtB2 5:evalcst | (cal2, saen, chg)<br>0: (0, 0, 0) 1: (5, 0, 0)<br>2: (2, 0, 0) 3: (3, 0, 0)<br>4: (4, 0, 0) 5: (0, 1, 0)<br>6: (0, 0, 1) |
| 11 | | | | | |
| 12 | | | saen | 1:active 0:inactive | |
| | | | chg | 1:active 0:inactive | |
| 13 | A REGISTER CONTROL | sregen_ctlA | usraen | 1:active 0:inactive | (usraen, naen)<br>0: (0, 0) 1: (1, 1) |
| | | | naen | 1:active 0:inactive | |
| 14 | B REGISTER CONTROL | sregen_ctlB | usrben | 1:active 0:inactive | (usrben, nben)<br>0: (0, 0) 1: (1, 1) |
| | | | nben | 1:active 0:inactive | |

Fig. 8

| BITS ADDRESSES | CONTROL CODES | | | | | | | | | | | | | | | DETAILS OF OPERATION |
|---|---|---|---|---|---|---|---|---|---|---|---|---|---|---|---|---|
| | 14 | 13 | 12 | 11 | 10 | 9 | 8 | 7 | 6 | 5 | 4 | 3 | 2 | 1 | 0 | |
| 0 | 0 | 0 | 0 | 0 | 0 | 0 | 1 | 0 | 0 | 0 | 0 | 0 | 0 | 1 | 1 | SYNDROME INPUT;SETTING OF A,L,B,M |
| 1 | 0 | 0 | 0 | 0 | 0 | 0 | 0 | 0 | 0 | 0 | 0 | 1 | 0 | 0 | 0 | REGISTER HOLD;CALCULATION OF 1/b |
| 2 | 0 | 0 | 0 | 1 | 0 | 0 | 1 | 0 | 0 | 0 | 0 | 0 | 0 | 0 | 0 | CALCULATION OF a/b |
| 3 | 1 | 1 | 0 | 1 | 0 | 1 | 1 | 1 | 0 | 1 | 0 | 0 | 0 | 0 | 0 | CALCULATION OF A+(a/b)B |
| 4 | 0 | 1 | 0 | 0 | 0 | 0 | 0 | 0 | 0 | 1 | 0 | 0 | 0 | 0 | 0 | A REGISTER SHIFT;CALCULATION OF 1/a |
| 5 | 0 | 0 | 0 | 0 | 0 | 0 | 1 | 0 | 0 | 0 | 1 | 0 | 0 | 1 | 0 | CALCULATION OF b/a |
| 6 | 1 | 1 | 0 | 1 | 1 | 1 | 1 | 1 | 1 | 0 | 1 | 1 | 1 | 0 | 0 | CALCULATION OF B+(b/a)A;SETTING OF HEAD-END 0 DATA |
| 7 | 1 | 1 | 0 | 1 | 1 | 1 | 1 | 1 | 1 | 0 | 1 | 0 | 0 | 0 | 0 | CALCULATION OF B+(b/a)A |
| 8 | 1 | 0 | 0 | 0 | 0 | 0 | 0 | 0 | 0 | 1 | 1 | 0 | 0 | 1 | 0 | SETTING OF A,L,B,M;SYNDROME INPUT |
| 9 | 1 | 1 | 0 | 1 | 0 | 1 | 1 | 1 | 0 | 1 | 0 | 1 | 0 | 0 | 0 | CALCULATION OF 1/b |
| 10 | 0 | 1 | 0 | 0 | 0 | 0 | 1 | 1 | 1 | 1 | 0 | 0 | 1 | 1 | 0 | CALCULATION OF A+(a/b)B;SETTING OF HEAD-END 0 DATA |
| 11 | 1 | 1 | 0 | 0 | 0 | 0 | 1 | 1 | 1 | 1 | 0 | 0 | 0 | 1 | 0 | A REGISTER SHIFT;SET FIRST REGISTER AT 0 |
| 12 | 0 | 1 | 0 | 0 | 0 | 0 | 0 | 0 | 0 | 1 | 0 | 0 | 0 | 0 | 0 | A REGISTER SHIFT;CALCULATION OF 1/a |
| 13 | 1 | 0 | 0 | 0 | 0 | 0 | 0 | 0 | 0 | 0 | 1 | 1 | 1 | 0 | 0 | B REGISTER SHIFT |
| 14 | 0 | 0 | 1 | 1 | 0 | 0 | 0 | 0 | 0 | 0 | 1 | 0 | 0 | 0 | 0 | TRANSFER OF σ DATA AND ω DATA TO A REGISTER |
| 15 | 0 | 0 | 0 | 0 | 0 | 0 | 0 | 0 | 1 | 1 | 1 | 0 | 0 | 1 | 0 | CALCULATION OF 1/b |
| 16 | 0 | 0 | 0 | 0 | 0 | 0 | 0 | 0 | 1 | 0 | 0 | 0 | 0 | 0 | 0 | FIND 1/a |
| 17 | 0 | 0 | 0 | 0 | 0 | 0 | 0 | 0 | 0 | 0 | 0 | 1 | 0 | 0 | 0 | REGISTER HOLD;CALCULATION OF 1/a |
| 18 | 0 | 1 | 0 | 0 | 0 | 0 | 0 | 0 | 0 | 0 | 0 | 1 | 0 | 0 | 0 | A REGISTER SHIFT;FIND 1/b |
| 19 | 1 | 0 | 0 | 0 | 0 | 0 | 0 | 0 | 0 | 0 | 1 | 0 | 0 | 0 | 0 | B REGISTER SHIFT;FIND 1/a |
| 20 | 0 | 0 | 0 | 0 | 1 | 1 | 0 | 0 | 0 | 0 | 0 | 0 | 0 | 0 | 0 | ERROR VALUE CALCULATION MODE |

REED-SOLOMON DECODER HAVING A THREE-STAGE PIPELINE STRUCTURE

BACKGROUND OF THE INVENTION

This invention relates to a decoder for multiple error correcting Reed-Solomon codes, that is to a Reed-Solomon decoder.

The Reed-Solomon code has been widely used as a code capable of correction of multiple errors in, for example, information stored in various mass storage devices and information transmitted in high-speed communication.

If a root of an equation $W(z)=0$ is $\alpha$ where $W(z)$ is a primitive polynomial, then the Reed-Solomon code is a code over a Galois field whose primitive element is the root $\alpha$. The Reed-Solomon code is one of the block error correcting codes. Here, let $\alpha$ be the primitive element of a Galois field $GF(2^m)$, and give consideration to a specific Reed-Solomon code having a code length n ($n=2^m-1$) and having roots $\alpha$, $\alpha^2, \ldots, \alpha^{2t}$. According to this Reed-Solomon code, m bits is one process unit, that is one symbol. The quantity of original information is n–2t symbols. In the following description, m=8 and one symbol is represented by eight bits, that is, one byte. A 1-packet received word is formed of n symbols. If t=8, this permits error correction of eight symbols.

The decoding of Reed-Solomon codes is carried out according to the following (i) to (vi) steps. However, when unreasonable results are yielded in the steps (iii)–(v), the judgement that uncorrectable errors have occurred is made.

(i) From the received polynomial $Y(z)$ the coefficients of which are symbols in a received word, the calculation of 2t syndromes, that is, s1, s2, . . . , s2t, is performed by:

$$si=Y(\alpha^i) \quad (1)$$

Each syndrome si is an element of the Galois field $GF(2^m)$. The syndrome polynomial $S(z)$ is defined by:

$$S(z)=s1+s2z+\ldots+s2tz^{2t-1} \quad (2)$$

(ii) If all the syndromes are zeros, the judgement that there occur no errors is made.

(iii) If there exists a non-zero syndrome, then an error locator polynomial $\sigma(z)$ and an error evaluator polynomial $\omega(z)$ are derived from the syndrome polynomial $S(z)$. That is, when $\phi(z)$ is a polynomial, a polynomial $\sigma(z)$ of degree equal to or less than t and a polynomial $\omega(z)$ of degree equal to or less than t–1 are found which satisfy the following formulas (3) and (4) and which are elements each other.

$$\phi(z)z^{2t}+\sigma(z)S(z)=\omega(z) \quad (3)$$

$$\sigma(0)=1 \quad (4)$$

(iv) k roots $\alpha^{-ju}$ (ju=j1, j2, . . . , jk) of an equation $\sigma(z)=0$ are found ($k \leq t$). Here, k is the degree of the error locator polynomial $\sigma(z)$, representing the number of errors. If a method is employed which determines whether $\sigma(\alpha^{-i})$ is zero or not by substitution of each one of $\alpha^{-i}$ (i=0, 1, . . . , n) in $\sigma(z)$, this makes it possible to search all the roots. Such a method is called the Chien search. Each of the k roots $\alpha^{-ju}$ is the reciprocal of a so-called error locator.

(v) The derivative of the error locator polynomial $\sigma(z)$ (i.e., $\sigma'(z)$) is obtained, and from the following formula (5) error values e1, e2, . . . , ek are found.

$$e_u = -\omega(\alpha^{-ju})/\sigma'(\alpha^{-ju}) \quad (5)$$

Here, $\omega(\alpha^{-ju})$ is called the error evaluation value, while on the other hand $\sigma'(\alpha^{-ju})$ is called the error locator polynomial differential value.

(vi) Error locations j1, j2, . . . , jk are found from k roots $\alpha^{-j1}, \alpha^{-j2}, \ldots, \alpha^{-jk}$, and errors in the received word are corrected by subtraction of the error values e1, e2, . . . , ek from symbols at the found error locations in the received word.

One of the methods for finding the error locator polynomial $\sigma(z)$ and the error evaluator polynomial $\omega(z)$ in the step (iii), is the Euclidean algorithm. The Euclidean algorithm is a procedure of finding $\sigma(z)$ and $\omega(z)$ by calculating the greatest common divisor polynomial of $Z^{2t}$ and $S(z)$ by Euclidean algorithm arithmetic operations.

A procedure of the Euclidean algorithm arithmetic operation is now discussed below. In the following description, the degree of a polynomial X is expressed by degX. In the first place, four polynomials, denoted receptively A, B, L, and M, are initialized as follows.

$$A=Z^{2t} \quad (6)$$

$$B=S(z) \quad (7)$$

$$L=0 \quad (8)$$

$$M=1 \quad (9)$$

If $degA \geq degB$, then the polynomials A and L are updated according to the following formulas (10) and (11) wherein a is the coefficient of the highest-degree term of the polynomial A and b is the coefficient of the highest-degree term of the polynomial B.

$$A=bA+aBz^{degA-degB} \quad (10)$$

$$L=bL+aMz^{degA-degB} \quad (11)$$

As a result of such updating, degA decreases while degL increases. Conversely, if degA<degB, the polynomials B and M are updated according to the following formulas (12) and (13).

$$B=aB+bAz^{degB-degA} \quad (12)$$

$$M=aM+bLz^{degB-degA} \quad (13)$$

As a result of such updating, degB decreases while degM increases. If iteration of such operation produces the situation that $degA \leq t-1$, then $\omega(z)=A$ and $\sigma(z)=L$. If $degB \leq t-1$, then $\omega(z)=B$ and $\sigma(z)=M$. In this way, the error locator polynomial $\sigma(z)$ and the error evaluator polynomial $\omega(z)$ are found.

If $degA \geq degB$ in the foregoing procedure, then the polynomials A and L are updated according to the formulas (14) and (15).

$$A=A+(a/b)Bz^{degA-degB} \quad (14)$$

$$L=L+(a/b)Mz_{degA-degB} \quad (15)$$

degA<degB, then the polynomials B and M are updated according formulas (16) and (17).

$$B=B+(b/a)Az^{degB-degA} \quad (16)$$

$$M=M+(b/a)Lz^{degB-degA} \quad (17)$$

Such is hereinafter called the "improved algorithm".

Japanese patent application, published under no. 3-195216, shows a Euclidean algorithm arithmetic operation circuit with a systolic array structure.

In recent years, Reed-Solomon codes with the specification that the number of errors to be corrected (t) ranges from eight to sixteen have become generalized. This means a considerable increase in the amount of calculation required in the error correcting processing, therefore producing the problem that if Reed-Solomon decoders employ a systolic array structure the circuit scale increases with the number of correctable errors.

SUMMARY OF THE INVENTION

Accordingly, an object of the present invention is to achieve a reduction in circuit scale of the Reed-Solomon decoder when the number of to-be-corrected errors is large.

With a view to achieving such an object, the present invention provides a Reed-Solomon decoder with a new organization. This Reed-Solomon decoder comprises (a) a first unit for finding a syndrome polynomial S(z) from a received polynomial Y(z) consisting of t-multiple error correcting Reed-Solomon codes, (b) a second unit for finding an error locator polynomial σ(z) and an error evaluator polynomial ω(z) by Euclidean algorithm arithmetic operations and for finding an error value $e_u$ by performing division operations, (c) a third unit for finding a root $\alpha^{-j_u}$ of the error locator polynomial α(z) by the Chien search and for providing an error evaluation value $\omega(\alpha^{-j_u})$ and an error locator polynomial differential value $\sigma'(\alpha^{-j_u})$ to the second unit, and (d) a fourth unit for finding an error location from the root $\alpha^{-j_u}$ and for finding an error-corrected polynomial W(z) by subtracting the error value $e_u$ from the error location in the received polynomial Y(z). Additionally, the present Reed-Solomon decoder employs a 3-stage pipeline structure where the three stages correspond to their respective one-packet cycles. The first unit forms the first pipeline stage, the second and third units form the second pipeline stage, and the fourth unit forms the third pipeline stage.

In accordance with the present invention, in the second pipeline stage the error locator polynomial σ(z) and the error evaluator polynomial ω(z) are obtained by Euclidean algorithm arithmetic operations carried out in the second unit. Then, the error locator polynomial's root $\alpha^{-j_u}$ is found by the Chien search conducted by the third unit, and the error evaluation value $\omega(\alpha^{-j_u})$ and the error locator polynomial differential value $\sigma'(\alpha^{-j_u})$ are passed to the second unit, and finally the error value $e_u$ is found by division operations in the second unit. In other words, it is arranged such that the second unit serves both as a Euclidean algorithm arithmetic operation calculator and as an error value calculator. Therefore, even in cases where the number of errors to be corrected is large, the present invention is able to provide a Reed-Solomon decoder smaller in circuit scale in comparison with ones with a systolic array structure.

The second unit includes (a) a data storage unit for storing signals representing a syndrome polynomial S(z) and feedback signals representing an intermediate result of a Euclidean algorithm arithmetic operation and for finally providing signals representing an error locator polynomial σ(z) and signals representing an error evaluator polynomial ω(z), (b) an arithmetic unit for generating the feedback signals from the signals stored in the data storage unit, and (c) a control unit for controlling the data storage unit and the arithmetic unit. The arithmetic has a single inverse element calculator, a single Galois multiplier, and a single Galois adder. In accordance with such an organization, iterative use of the inverse element calculator, the Galois multiplier, and the Galois adder implements Euclidean algorithm arithmetic operations and error value calculations with a small-scale circuit.

The data storage unit has a first, a second, and a third shift register wherein each of the first and second shift registers consists of registers of 2t+2 stages and the third shift register consists of registers of t−1 stages. The control unit includes a degree counter for monitoring the degree of intermediate polynomials in the Euclidean algorithm arithmetic operation.

The first shift register is used to store the polynomials A and L and the second shift register is used to store the polynomials B and M, provided that the degree of the polynomials A and B decreases by one in a procedure of Euclidean algorithm arithmetic operations. In such a circumstance, the third shift register is not used at all. The Euclidean algorithm arithmetic operation will terminate at the time either one of the. polynomial A and the polynomial B becomes a polynomial of degree equal to or less than t−1. However, in some cases the degree of the polynomial A or the polynomial B exceptionally decreases by two at one time, which is called the "multi-degree" reduction. To effectively deal with such a multi-degree reduction, the third shift register is provided. In other words, if there occurs such an exceptional reduction, either a shift register of 3t+1 stages resulting from combining the first and third shift registers or a shift register of 3t+1 stages resulting from combining the second and third shift registers is used.

BRIEF DESCRIPTION OF THE DRAWINGS

FIG. 7 is a diagram showing the details of storage control code signals and arithmetic control code signals generated in a control code generator of FIG. 6.

FIG. 8 is a diagram showing a procedure of controlling the operation of the Euclidean algorithm arithmetic operation/error value calculation unit of FIG. 3.

DETAILED DESCRIPTION OF THE INVENTION

Figure 1:
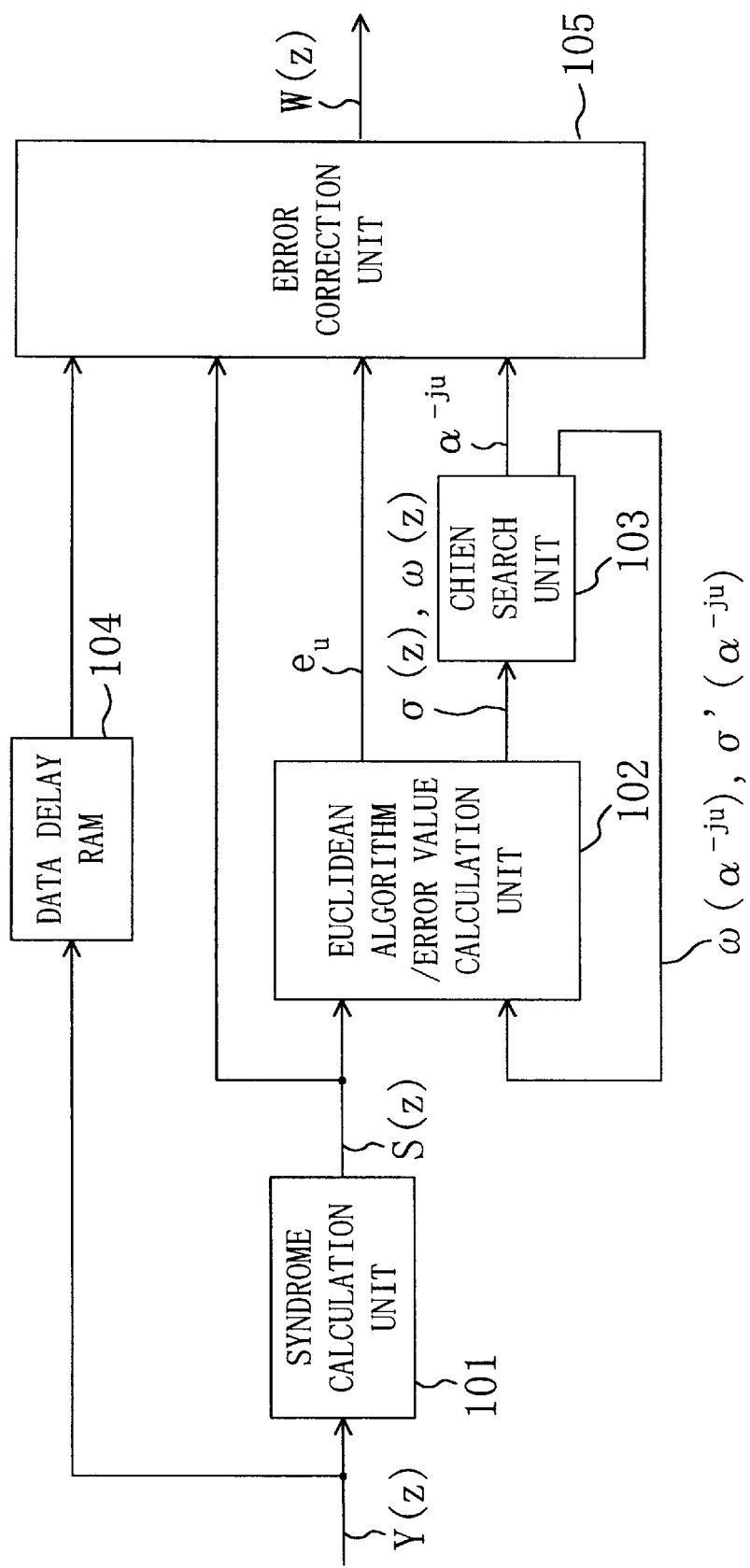
FIG. 1 is a block diagram showing the organization of a Reed-Solomon decoder according to the present invention.

FIG. 1 illustrates a Reed-Solomon decoder organized according to the present invention. This Reed-Solomon decoder is constructed of a syndrome calculation unit 101, a Euclidean algorithm (mutual division) arithmetic operation/error value calculation (EV) unit 102, a Chien search unit 103, a data delay RAM (random access memory) 104, and an error correction unit 105. The syndrome calculation unit 101 finds, from a received polynomial Y(z) consisting of t-multiple error correcting Reed-Solomon codes, a syndrome polynomial S(z) defined by the formula (2). In more concrete terms, the received polynomial Y(z) is a polynomial whose coefficients are symbols in a received word. From the received polynomial Y(z), 2t syndromes, i.e., s1, s2, ..., s2t, are calculated by the formula (1). If all of these 2t syndromes are zeros, the error correction unit 105 makes judgement that there occur no errors. The EV unit 102 finds, from the syndrome polynomial S(z), an error locator polynomial σ(z) and an error evaluator polynomial ω(z) according to the improved algorithm previously mentioned. In more concrete terms, a polynomial σ(z) of degree equal to or less than t and a polynomial ω(z) of degree equal to or less than t−1 are found which satisfy the formulas (3) and (4) and which are elements each other. This unit 102 is provided, from the Chien search unit 103, with k error evaluation values ω($\alpha^{-ju}$) and k error locator polynomial differential values ω'($\alpha^{-ju}$) where k≦t, and finds, from the formula (5), k error values $e_u$ (e1, e2, ..., ek). The Chien search unit 103 finds k roots $\alpha^{-ju}$ (ju=j1, j2, ..., jk) of an equation of σ(z)=0 and provides the k roots $\alpha^{-ju}$ found to the error correction unit 105. In addition to such a function, the unit 103 is operable to provide error evaluation values ω($\alpha^{-ju}$) obtained by substitution of each one of the k roots $\alpha^{-ju}$ in the error evaluator polynomial ω(z) and error locator polynomial differential values σ'($\alpha^{-ju}$) obtained by substitution of each one of the k roots $\alpha^{-ju}$ in a derivative, σ'(z), of the error locator polynomial σ(z), to the EV unit 102. The data delay RAM 104 is a means by which the received polynomial Y(z) is delayed just two packet cycles. The error correction unit 105 finds error locations j1, j2, ..., jk on the basis of the k roots $\alpha^{-ju}$ received from the Chien search unit 103, corrects errors in the received word by subtraction of the error values e1, e2, ..., ek from symbols at the error locations of the received polynomial Y(z) from the data delay RAM 104, and outputs the result of the correction, i.e., an error-corrected polynomial W(z).

Figure 2:
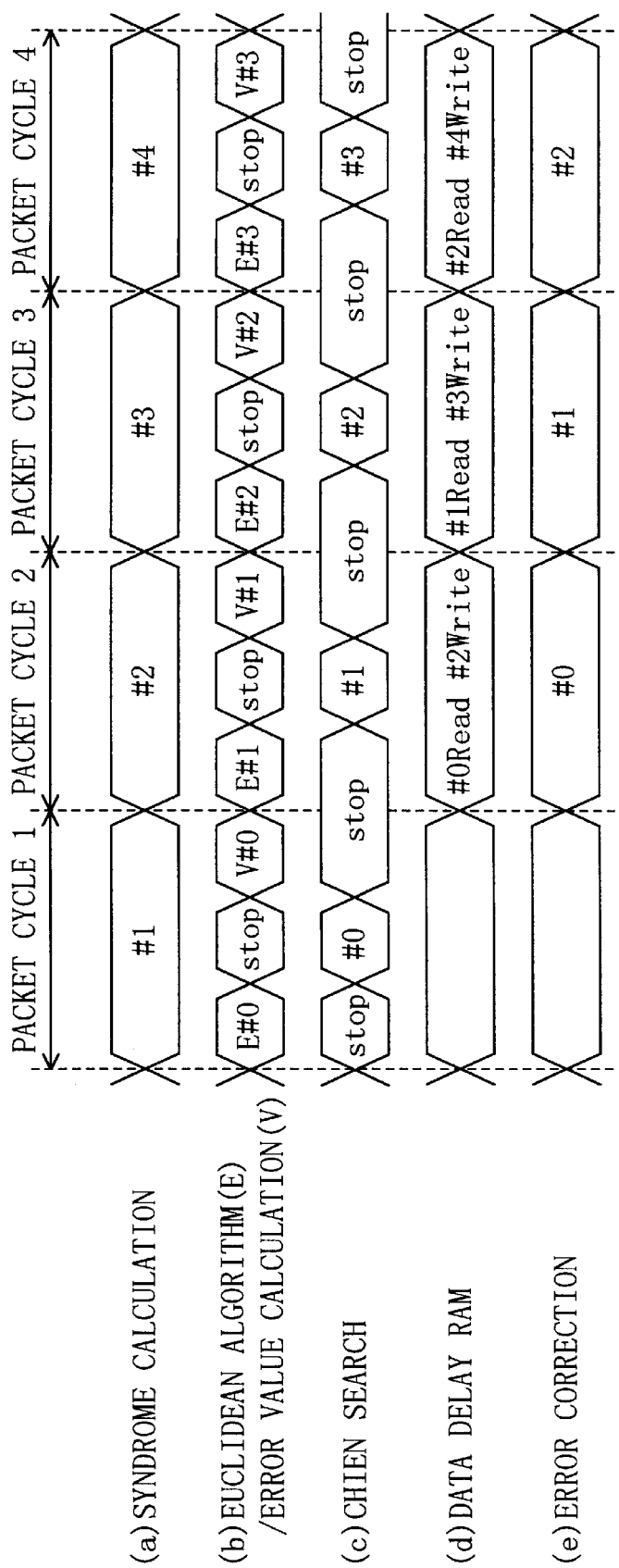
FIG. 2 is a time chart showing the operation of the Reed-Solomon decoder of FIG. 1.

FIG. 2 shows the pipeline operation of the Reed-Solomon decoder of FIG. 1 consisting of three stages. In a first packet cycle, the unit 101 implements the syndrome calculation of Packet #1. In a second packet cycle, the unit 102 implements the Euclidean algorithm arithmetic operation of Packet #1, the unit 103 conducts the Chien search of Packet #1, and the unit 102 implements the error value calculation of Packet #1. In a third packet cycle, the unit 105 reads Packet #1 out of the data delay RAM 104 and performs error correction thereof. In order to realize such pipeline operation, it is set such that the frequency of clock signals (not shown in the figure) applied to the units 102 and 103 is four times that of clock signals (not shown) applied to the other units. This improves the efficiency of the Reed-Solomon decoding when the number of error corrections, t, is large. In the third packet cycle, the read of Packet #1 out of the data delay RAM 104 is carried out concurrently with the write of Packet #3 into the data delay RAM 104.

Figure 3:
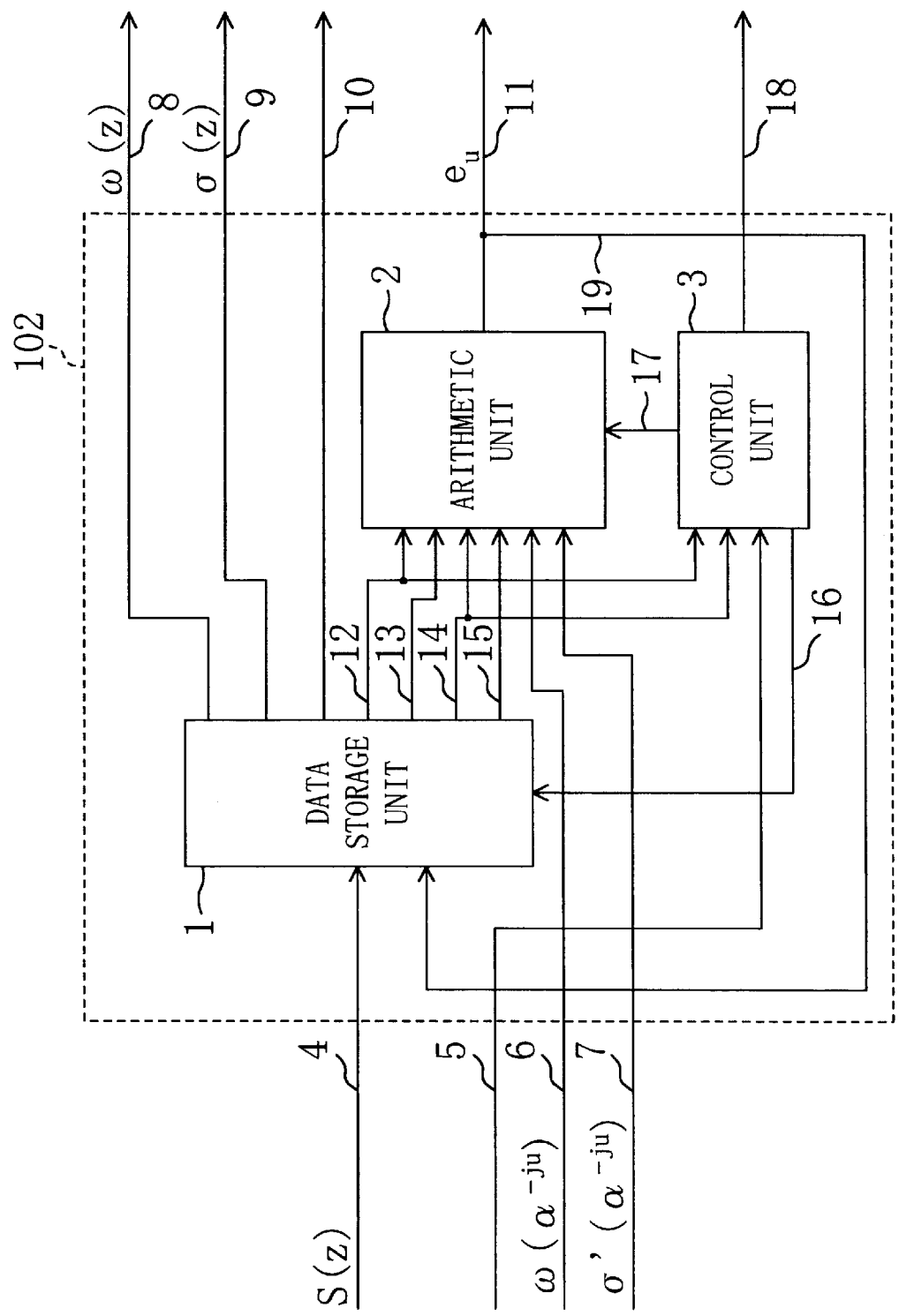
FIG. 3 is a block diagram showing the internal organization of a Euclidean algorithm arithmetic operation/error value calculation unit of FIG. 1.

FIG. 3 illustrates the internal organization of the EV unit 102 of FIG. 1. The EV unit 102, shown in FIG. 3, includes a data storage unit 1, an arithmetic unit 2, and a control unit 3. The data storage unit 1 stores a signal 4 (syndrome signal) representing the syndrome polynomial S(z) and a signal 19 (feedback data signal) representing an intermediate result of the Euclidean algorithm arithmetic operation, provides a first to fourth calculation data signals 12, 13, 14, and 15 relative to the intermediate polynomial, and finally provides a signal 9 (σ signal) representing the error locator polynomial σ(z) and a signal 8 (ω signal) representing the error evaluator polynomial ω(z). This data storage unit 1 further has the function of providing a process error signal 10 at the time of detection of unreasonable results. The arithmetic unit 2 generates the feedback data signal 19 from the first to fourth calculation data signals 12 to 15. In addition to such a function, the arithmetic unit 2 has the function of receiving a signal 6 (ω value signal) representing the error valuation value ω($\alpha^{-ju}$) and a signal 7 (σ differential value signal) representing the error locator polynomial differential value σ'($\alpha^{-ju}$), and supplying a signal 11 (error value signal) representing the error value $e_u$. The control unit 3 receives a process starting signal 5, the first calculation data signal 12, and the third calculation data signal 14 and provides a storage control code signal 16 for controlling the data storage unit 1 and an arithmetic operation control code signal 17 for controlling the arithmetic unit 2. The control unit 3 further has the function of providing a process terminating signal 18.

Figure 4:
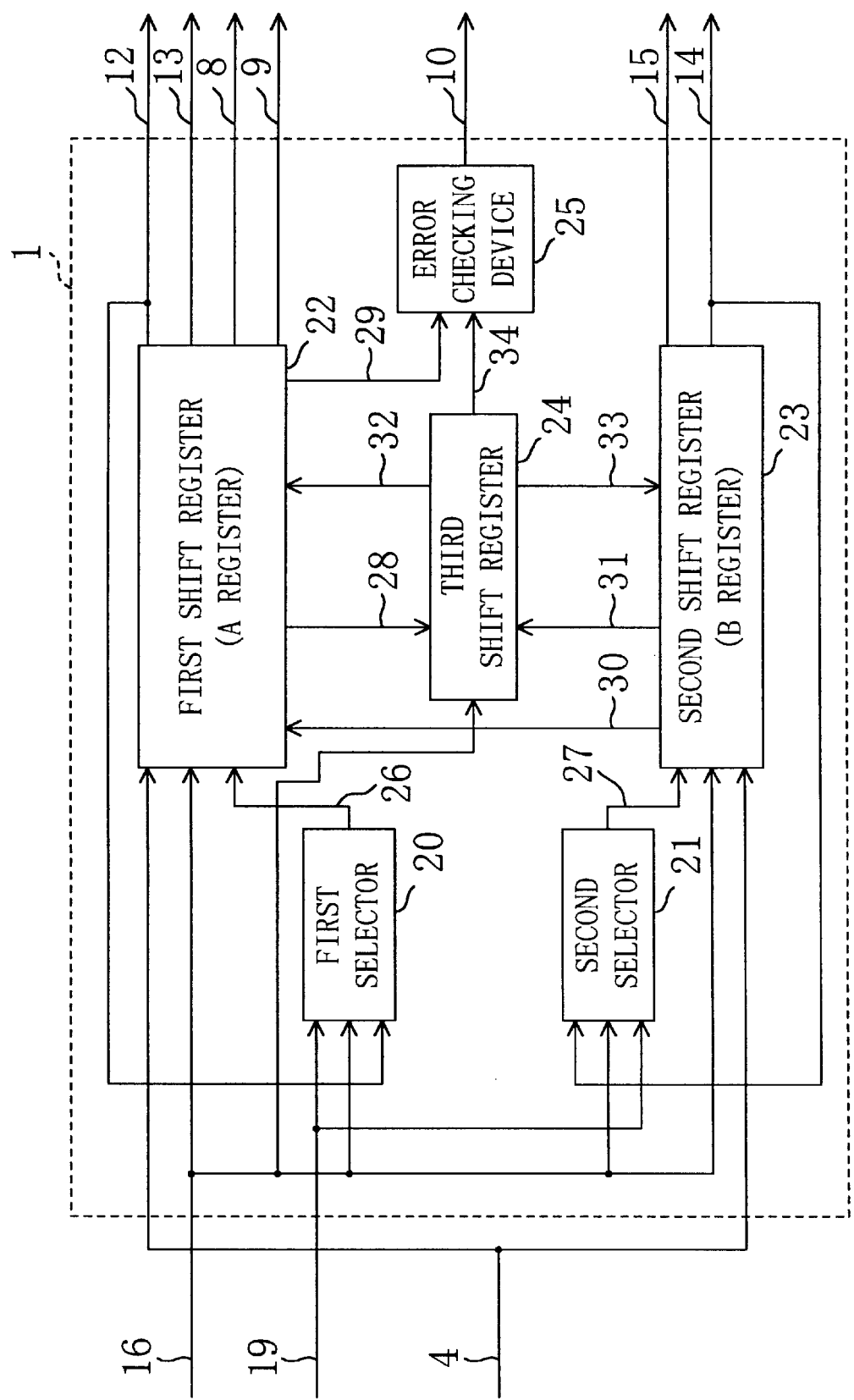
FIG. 4 is a block diagram showing the internal organization of a data storage unit of FIG. 3.

FIG. 4 illustrates the internal organization of the data storage unit 1 shown in FIG. 3. Referring to FIG. 4, 20 is a first selector, 21 is a second selector, 22 is a first shift register (A register), 23 is a second shift register (B register), 24 is a third shift register, and 25 is an error checking device. According to the storage control code signal 16, the first selector (sel0) 20 provides, as a first selection signal 26, any one of the feedback data signal (addatA) 19, the first calculation data signal (sftdtA) 12, and a data signal (intA0) with a constant of 0. According to the storage control code signal 16, the second selector (sel1) 21 provides, as a second selection signal 27, any one of the third calculation data signal (sftdtB) 14, the feedback data signal (addatB) 19, and a data signal (intM0) with a constant of 0. The first shift register 22 is formed of registers of 2t+2 stages for storing coefficients of polynomials A and L in the Euclidean algorithm arithmetic operation. The first shift register 22 receives the syndrome signal (il) 4, the storage control code signal 16, and the first selection signal 26 and provides the ω signal 8, the σ signal 9, the first calculation data signal 12, and the second calculation data signal 13. The second shift register 23 is formed of registers of 2t+2 stages for storing coefficients of polynomials B and M in the Euclidean algorithm arithmetic operation. The second shift register 23 receives the syndrome signal (il) 4, the storage control code signal 16, and the second selection signal 27 and provides the third calculation data signal 14 and the fourth calculation data signal 15. Further, the second shift register 23 provides a fifth calculation data signal 30 to the first shift register 22. The third shift register 24 is formed of registers of t−1 stages controlled by the storage control code signal 16. The third shift register 24 provides a sixth calculation data signal 33 to the second shift register 23. The first shift register 22 provides a seventh calculation data signal 28 to the third shift register 24. The third shift register 24 provides an eighth calculation data signal 32 to the first shift register 22. The second shift register 31 provides a ninth calculation data signal 31 to the third shift register 24. The error checking device 25 generates the process error signal 10 on the basis of a tenth calculation data signal 29 supplied from the first shift register 22 and an eleventh calculation data signal 34 supplied from the third shift register 24.

The first calculation data signal 12 is one supplied from a register at the (2t+2)nd stage of the first shift register 22. The second calculation data signal 13 is supplied from a register at the (2t +1)st stage of the first shift register 22. The third calculation data signal 14 is supplied from a register at the (2t+2)nd stage of the second shift register 23. The fourth calculation data signal 15 is supplied from the (2t +1)st stage of the second shift register 23. The fifth calculation data signal (chg) 30 is one that is transmitted from all the registers in the second shift register 23 to all the registers in the first shift register 22.

If a united storage device of the first shift register 22 and the third shift register 24 is formed for the occurrence of a multi-degree reduction in the Euclidean algorithm arithmetic operation, it is arranged such that the registers of t−1 stages forming the third shift register 24 are connected between the second-stage register and the third-stage register of the first shift register 22. The seventh calculation data signal (usraen) 28 is one that is supplied from the second-stage register of the first shift register 22 to the first-stage register of the third shift register 24. The eighth calculation data signal (naen) 32 is one that is supplied from the (t−1)st-stage register of the third shift register 24 to the third-stage register of the first shift register 22.

If a united storage device of the second shift register 23 and the third shift register 24 is formed for the occurrence of a multi-degree reduction in the Euclidean algorithm arithmetic operation, it is arranged such that the registers of t−1 stages forming the third shift register 24 are connected between the second-stage register and the third-stage register of the second shift register 23. The ninth calculation data signal (usrben) 31 is one that is supplied from the second-stage register of the second shift register 23 to the first-stage register of the third shift register 24. The sixth calculation data signal (nben) 33 is one that is supplied from the (t−1)st-stage register of the third shift register 24 to the third-stage register of the second shift register 23.

The tenth calculation data signal 29 is supplied from registers of t−1 stages from the (t+4)th stage to the (2t+2)nd stage of the first shift register 22, for processing error check. The eleventh calculation data signal 34 is supplied from registers of t−1 stages of the third shift register 24, for processing error check. The ω signal 8 is supplied from registers of t stages from the (t+3)rd stage to the (2t+2)nd stage of the first shift register 22. The σ signal 9 is supplied from registers of t+1 stages from the second stage to the (t+2)nd stage of the first shift register 22. However, at the time of the occurrence of a multi-degree reduction, the σ signal 9 is supplied from registers of t stages from the third stage to the (t+2)nd stage of the first shift register 22 as well as from the (t−1)st-stage register of the third shift register 24.

Figure 5:
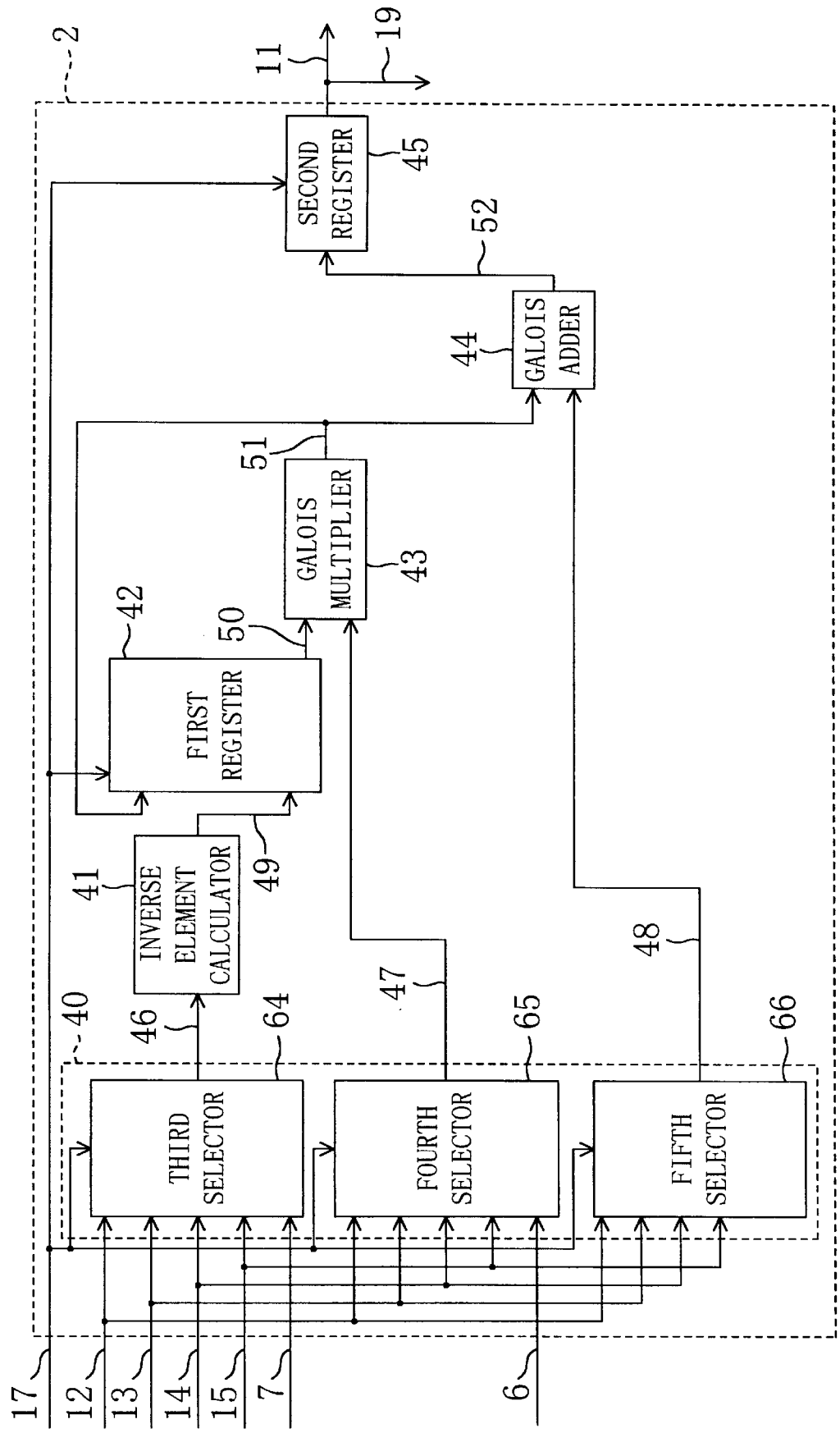
FIG. 5 is a block diagram showing the internal organization of an arithmetic unit of FIG. 3.

FIG. 5 is a diagram showing the internal organization of the arithmetic unit 2 of FIG. 3. Referring to FIG. 5, 40 is an arithmetic input selector, 41 is an inverse element calculator, 42 is a first register, 43 is a Galois multiplier, 44 is a Galois adder, and 45 is a second register. The arithmetic input selector 40 includes a third selector 64, a fourth selector 65, and a fifth selector 66. According to the arithmetic control code signal 17, the third selector (cal0) 64 provides any one of the first calculation data signal (rvdtA) 12, the third calculation data signal (rvdtB) 14, the second calculation data signal (prvdtA) 13, the fourth calculation data signal (prvdtB) 15, and the σ differential value signal (sgmd) 7, as a third selection signal 46. According to the arithmetic control code signal 17, the fourth selector (cal1) 65 provides any one of the ω value signal (omgmgn) 6, the first calculation data signal (mldtA) 12, the third calculation data signal (mldtb) 14, the second calculation data signal (pmldtA) 13, and the fourth calculation data signal (pmldtB) 15, as a fourth selection signal 47. According to the arithmetic control code signal 17, the fifth selector (cal2) 66 provides any one of the first calculation data signal (addtA) 12, the third calculation data signal (addtB) 14, the second calculation data signal (paddtA) 13, the fourth calculation data signal (paddtB) 15, a first constant data signal (addtB2), and a second constant data signal (evalcst), as a fifth selection signal 48. The inverse element calculator 41 provides the reciprocal of the third selection signal 46 as an inverse element data signal 49. The first register 42 holds and provides the inverse element data signal 49 as an intermediate data signal 50. The Galois multiplier 43 provides the product of the intermediate data signal 50 and the fourth selection signal (sben) 47 activated, as a product data signal 51. The first register 42 may hold the product data signal 51 supplied from the Galois multiplier 43 and provide the product data signal 51 to the Galois multiplier 43 as the intermediate data signal 50. The arithmetic control code signal 17 determines which one of the inverse element data signal (revdat) 49 and the product data signal (revdmul) 51 should be held in the first register 42. The Galois adder 44 provides the sum of the product data signal 51 and the fifth selection signal (saen) 48 activated, as a sum data signal 52. In response to the arithmetic control code signal 17, the second register 45 holds the sum data signal (mul) 52 and provides it either as the feedback data signal 19 or as the error value signal 11.

Figure 6:
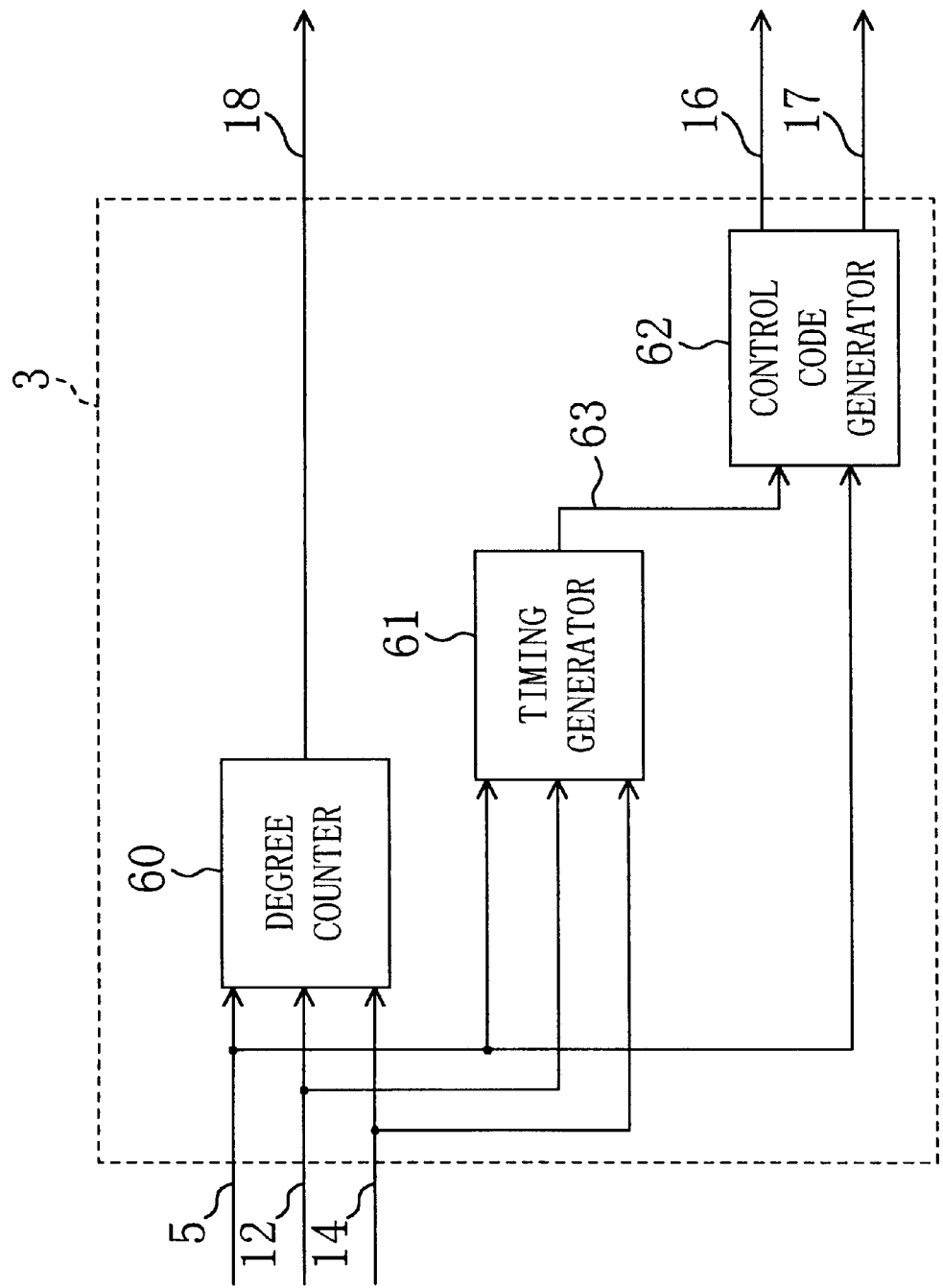
FIG. 6 is a block diagram showing the internal organization of a control unit of FIG. 3.

Referring now to FIG. 6, the internal organization of the control unit 3 of FIG. 3 is described. In FIG. 6, 60 is a degree counter, 61 is a timing generator, and 62 is a control code generator. When the degree counter 60 is fed the process starting signal 5, the degree counter 60 starts counting and keeps monitoring the degree of the intermediate polynomials in the Euclidean algorithm arithmetic operation. In more concrete terms, the degree counter 60 keeps watching the first calculation data signal 12 and the third calculation data signal 14 and sends out the process terminating signal 18 when either one of degA and degB falls below t. When the timing generator 61 is fed the process starting signal 5, the timing generator 61 starts operating and provides a control timing signal 63 while making reference to the first calculation data signal 12 and to the third calculation data signal 14. Upon receipt of the process starting signal 5 and the control timing signal 63, the control code generator 62 generates the storage control code signal 16 and the arithmetic control code signal 17.

FIG. 7 shows in detail the storage control code signal 16 and the arithmetic control code signal 17 generated in the control code generator 62 shown in FIG. 6. Each of these control code signals 16 and 17 are implemented by a control code of 15 bits. Referring now to FIG. 7, Bit 14 is labeled "sregen-ctlB", Bit 13 is labeled "sregen-ctlA", Bits 12, 11, and 10 are labeled "adin-ctl[2:0]", Bit 9 is labeled "breg-ctl", Bits 8 and 7 are labeled "mulreg-ctl[1:0]", Bits 6, 5, and 4 are labeled "mulin-ctl[2:0], Bits 3, 2, and 1 are labeled "reg-ctl[2:0], and Bit 0 is labeled "initreg-ctl".

FIG. 8 is a diagram showing a procedure of controlling the operation of the EV unit 102. Addresses, shown in FIG. 8, are ones supplied, as the timing signal 63, from the timing generator 61 to the control code generator 62, and the 15 bits forming a control code of FIG. 8 is the same as the ones described in FIG. 7.

Figure 9:
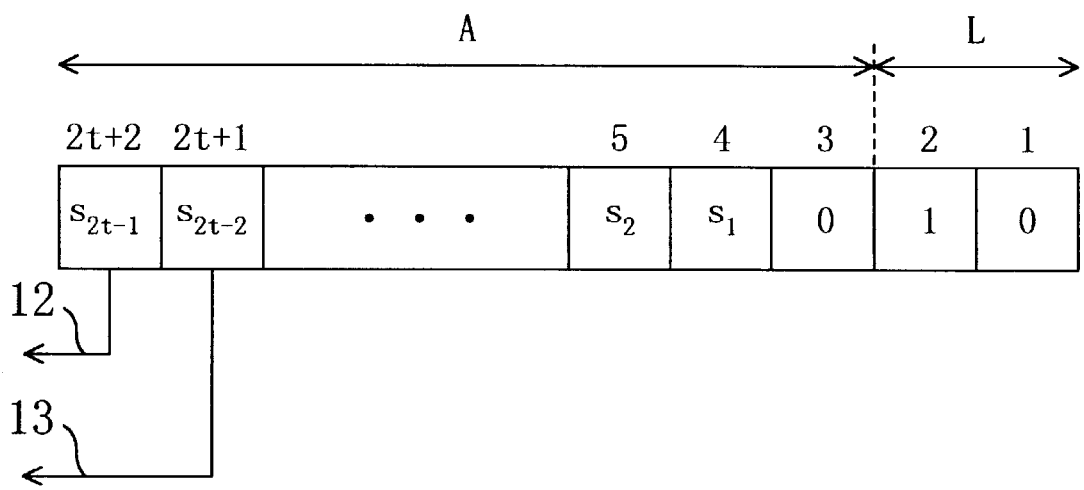
FIG. 9 is a diagram showing an initial setting of a first shift register of FIG. 4.
Figure 10:
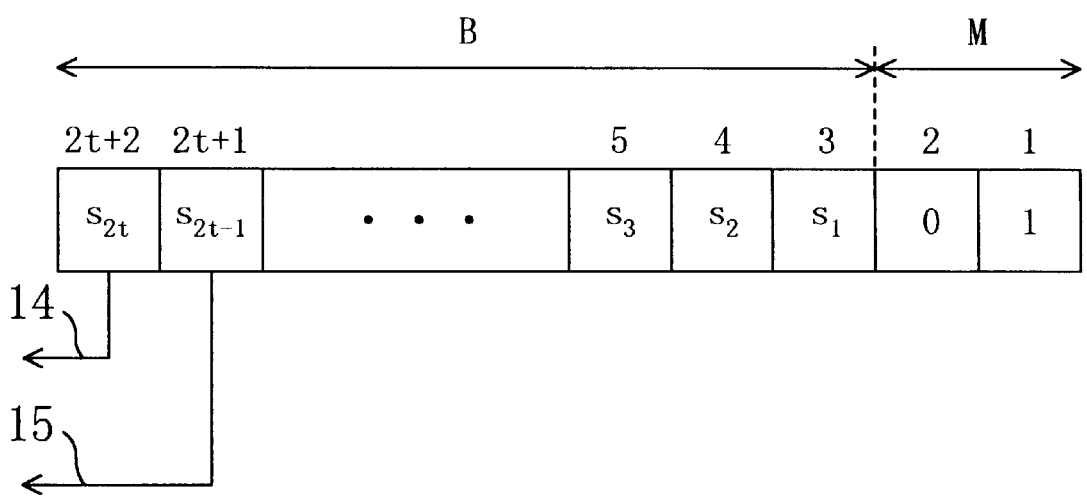
FIG. 10 is a diagram showing an initial setting of a second shift register of FIG. 4.

Euclidean algorithm arithmetic operations in the unit 102 are now explained. FIG. 9 is a diagram showing an initial setting of the first shift register 22. FIG. 10 is a diagram showing an initial setting of the second shift register 23. As shown in FIG. 9, of the 2t syndromes (s1, s2, . . . , s2t) supplied as the syndrome signal 4, 2t−1 syndromes, exclusive of the syndrome s2t relative to the highest degree, are stored in registers of 2t−1 stages from the fourth stage to the (2t+2)nd stage of the first shift register 22. Constant data 0 is stored in the first-stage register. Constant data 1 is stored in the second-stage register. Constant data 0 is stored in the third-stage register. The first- and second-stage registers represent initial coefficients of the polynomial L. The registers of 2t stages from the third stage to the (2t+2)nd stage represent initial coefficients of the polynomial A. On the other hand, as shown in FIG. 10, the 2t syndromes (s1, s2, ..., s2t) are stored in registers of 2t stages from the third stage to the (2t+2)nd stage of the second shift register 23. Constant data 1 is stored in the first-stage register. Constant data 0 is stored in the second-stage register. The first- and second-stage registers represent initial coefficients of the polynomial M. The registers of 2t stages from the third stage to the (2t+2)nd stage represent initial coefficients of the polynomial B.

In the Euclidean algorithm arithmetic operation, the four polynomials A, B, L, and M are initialized as shown in the formulas (6), (7), (8), and (9), respectively. That is, in the initial condition, the degree of the polynomial A is 2t and the degree of the polynomial B is 2t−1 at most. Therefore, degA≧degB holds. Accordingly, by pre-updating the polynomials A and L, it is possible to allow degA and degL to have decreased and increased, respectively. The polynomial A of degree 2t−1 and the polynomial L of degree 1, shown in FIG. 9, are results of such pre-updating. Accordingly, in the first place the first shift register 22 outputs the syndrome s2t−1 as the first calculation data signal 12 and the second shift register 23 outputs the syndrome s2t as the third calculation data signal 14.

Firstly, the control unit 3 receives the syndrome s2t−1 that represents a (the coefficient of the highest-degree term of the polynomial A) as the first calculation data signal 12 and the syndrome s2t that represents b (the coefficient of the highest-degree term of the polynomial B) as the third calculation data signal 14. In such a case, degA≧degB and the control unit 3 therefore provides the storage control code signal 16 and the arithmetic control code signal 17 in order that the polynomial A and the polynomial L may be updated according to the formula (14) and the formula (15). In other words, in the arithmetic unit 2 the quotient of a by b (a/b) is first stored in the first register 42. The calculation of the formulas (14) and (15) is performed on each of the first and third calculation data signals 12 and 14 which are sequentially transmitted by the shift operation of the first and second shift registers 22 and 23. Meanwhile, in the data storage unit 1, the feedback data signal 19 is passed via the first selector 20 to the first shift register 22 and the third calculation data signal 14 is passed via the second selector 21 to the second shift register 23. As a result, the updated polynomials A and L are stored in the first shift register 22, while on the other hand the polynomials B and M, not updated, are stored in the second shift register 23.

If updating the polynomial A produces the situation that degA<degB, the control unit 3 then provides the storage control code signal 16 and the arithmetic control code signal 17 in order that the polynomials B and M may be updated according to the formulas (16) and (17). In other words, in the arithmetic unit 2 the quotient of b by a (b/a) is first stored in the first register 42. Then, the calculation of the formulas (16) and (17) are performed on each of the first and third calculation data signals 12 and 14 which are sequentially transmitted by the shift operation of the first and second shift registers 22 and 23. Meanwhile, in the data storage unit 1, the feedback data signal 19 is passed via the second selector 21 to the second shift register 23 and the first calculation data signal 12 is passed via the first selector 20 to the first shift register 22. As a result, the updated polynomials B and M are stored in the second shift register 23 and the polynomials A and L, not updated, are stored in the first shift register 22.

If iteration of such operation produces the situation that any one of degA and degB falls below t, the control unit 3 provides the process terminating signal 18. If degA≦t−1, the first shift register 22 provides the ω signal 8 and the σ signal 9 in order that both ω(z)=A and σ(z)=L may hold. If degB≦t−1, the first shift register 22 provides the ω signal 8 and the σ signal 9 after the transfer of signals from all the registers of the second shift register 23 to all the registers of the first shift register 22 in order that both ω(z)=B and σ(z)=M may hold.

At the time of the occurrence of a multi-degree reduction in the foregoing Euclidean algorithm arithmetic operation, the third shift register 24 is utilized. In other words, when such a reduction occurs in the polynomial A, a sole storage device formed of the first shift register 22 and a united storage device formed of the second and third shift registers 23 and 24 are used. On the other hand, when the reduction occurs in the polynomial B, a sole storage device formed of the second shift register 23 and a united storage device formed of the first and third shift registers 22 and 24 are used. There may be cases in which the second calculation data signal 13 is used in place of the first calculation data signal 12 and the fourth calculation data signal 15 is used in place of the third calculation data signal 14 because of the circumstances of the data storage control.

The error locator polynomial σ(z) and the error evaluator polynomial ω(z), derived from the above-described Euclidean algorithm arithmetic operation, are passed to the Chien search unit 103. The Chien search unit 103 finds the error evaluation value $\omega(\alpha^{-ju})$ and the error locator polynomial differential value $\sigma'(\alpha^{-ju})$ The arithmetic unit 2 of FIG. 5 further has the ability to generate, from the ω value signal 6 representing $\omega(\alpha^{-ju})$ and the σ differential value signal 7 representing $\sigma'(\alpha^{-ju})$, the signal 11 representing the error value $e_u$. At this time, the third selector 64 chooses the σ differential value signal 7, the fourth selector 65 chooses the ω value signal 6, and the fifth selector 66 chooses the constant data 0. This permits execution of error value calculations according to the formula (5).

What is claimed is:

1. A Reed-Solomon decoder comprising:

a first unit for finding a syndrome polynomial S(z) from a received polynomial Y(z) consisting of t-multiple error correcting Reed-Solomon codes where t is any positive integer;

a second unit, having a single inverse element calculator, a single Galois multiplier, and a single Galois adder, for finding from said syndrome polynomial S(z) an error locator polynomial σ(z) and an error evaluator polynomial ω(z) by performing a Euclidean algorithm arithmetic operation implemented by iterative use of said inverse element calculator, said Galois mulitplier, and said Galois adder, and for calculating k error values $e_u$ by dividing k error evaluation values by corresponding error locator polynomial differential values where k is any positive integer and is equal to or less than t, said calculation to find said k error values $e_u$ being also implemented by iterative use of said inverse element calculator, said Galois multiplier, and said Galois adder;

a third unit for finding k roots $\alpha^{-ju}$ of said error locator polynomial σ(z) by conducting a Chien search and for providing error evaluation values obtained by substituting each one of said k roots $\alpha^{-ju}$ in said error evaluator polynomial ω(z) and error locator polynomial differential values obtained by substituting each one of said k roots $\alpha^{-ju}$ in a derivative of said error locator polynomial σ(z), to said second unit; and a fourth unit for finding k error locations from said k roots $\alpha^{-ju}$ and for finding an error-corrected polynomial W(z) by subtracting said k error values $e_u$ from said k error locations in said received polynomial Y(z), respectively;

wherein said first unit forms a first pipeline stage corresponding to a first packet cycle, said second and third units form a second pipeline stage corresponding to a second packet cycle following said first packet cycle, and said fourth unit forms a third pipeline stage corresponding to a third packet cycle following said second packet cycle.

2. A Reed-Solomon decoder comprising:

a first unit for finding a syndrome polynomial S(z) from a received polynomial Y(z) consisting of t-multiple error correcting Reed-Solomon codes where t is any positive integer;

a second unit for finding from said syndrome polynomial S(z) an error locator polynomial σ(z) and an error evaluator polynomial ω(z) by performing a Euclidean algorithm arithmetic operation and for calculating k error values $e_u$ by dividing k error evaluation values by corresponding error locator polynomial differential values where k is any positive integer and is equal to or less than t;

a third unit for finding k roots $\alpha^{-ju}$ of said error locator polynomial ω(z) by conducting a Chien search and for providing error evaluation values obtained by substituting each one of said k roots $\alpha^{-ju}$ in said error evaluator polynomial ω(z) and error locator polynomial differential values obtained by substituting each one of said k roots $\alpha^{-ju}$ in a derivative of said error locator polynomial σ(z), to said second unit; and a fourth unit for finding k error locations from said k roots $\alpha^{-ju}$ and for finding an error-corrected polynomial W(z) by subtracting said k error values $e_u$ from said k error locations in said received polynomial Y(z), respectively;

said second unit including:
  a data storage unit for storing signals representing said syndrome polynomial S(z) and feedback signals representing an intermediate result of said Euclidean algorithm arithmetic operation and for finally providing signals representing said error locator polynomial σ(z) and signals representing said error evaluator polynomial $_{107}$ (z);

an arithmetic unit for generating said feedback signals from said signals stored in said data storage unit and for implementing division to find said k error values $e_u$, said arithmetic unit having a single inverse element calculator, a single Galois multiplier, and a single Galois adder; and a control unit for controlling said data storage unit and said arithmetic unit;

wherein said Euclidean algorithm arithmetic operation is implemented by iterative use of said inverse element calculator, said Galois multiplier, and said Galois adder and said calculation to find said k error values $e_u$ is also implemented by iterative use of said inverse element calculator, said Galois multiplier, and said Galois adder.

3. The Reed-Solomon decoder according to claim 2, wherein said first unit forms a first pipeline stage corresponding to a first packet cycle, said second and third units form a second pipeline stage corresponding to a second packet cycle following said first packet cycle, and said fourth unit forms a third pipeline stage corresponding to a third packet cycle following said second packet cycle.

4. The Reed-Solomon decoder according to claim 2, wherein said data storage unit includes a first, second, and third shift registers,
  each of said first and second shift registers consisting of registers of 2t+2 stages; and
  said third shift register consisting of registers of t−1 stages.

5. The Reed-Solomon decoder according to claim 2, wherein said control unit includes a degree counter for monitoring the degree of intermediate polynomials in said Euclidean algorithm arithmetic operation.

6. A Euclidean algorithm arithmetic operation system for finding an error locator polynomial σ(z) and an error evaluator polynomial ω(z) from a syndrome polynomial S(z) relative to t-multiple error correcting Reed-Solomon codes where t is any positive integer, said system comprising:

a data storage unit for storing signals representing said syndrome polynomial S(z) and feedback signals representing an intermediate result of a Euclidean algorithm arithmetic operation and for finally providing signals representing said error locator polynomial σ(z) and signals representing said error evaluator polynomial ω(z);

an arithmetic unit for generating said feedback signals from said signals stored in said data storage unit; and a control unit for controlling said data storage unit and said arithmetic unit;

said data storage unit including:
  a first, second, and third shift registers;
  each of said first and second shift registers consisting of registers of 2t+2 stages; and
  said third shift register consisting of registers of t−1 stages;

said arithmetic unit having a single inverse element calculator, a single Galois multiplier, and a single Galois adder;

wherein said Euclidean algorithm arithmetic operation is implemented by iterative use of said inverse element calculator, said Galois multiplier, and said Galois adder.

7. The Euclidean algorithm arithmetic operation system according to claim 6 wherein said control unit includes a degree counter for monitoring the degree of intermediate polynomials in said Euclidean algorithm arithmetic operation.

* * * * *